US012009023B2

(12) United States Patent
Wu et al.

(10) Patent No.: US 12,009,023 B2
(45) Date of Patent: Jun. 11, 2024

(54) TRAINING FOR CHIP SELECT SIGNAL READ OPERATIONS BY MEMORY DEVICES

(71) Applicant: Intel Corporation, Santa Clara, CA (US)

(72) Inventors: Zhenglong Wu, Shanghai (CN); Tonia G. Morris, Wendell, NC (US); Christina Jue, Cedar Park, TX (US); Daniel Becerra Perez, Zapopan (MX); David G. Ellis, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 305 days.

(21) Appl. No.: 17/441,667

(22) PCT Filed: May 24, 2019

(86) PCT No.: PCT/CN2019/088263
§ 371 (c)(1),
(2) Date: Sep. 21, 2021

(87) PCT Pub. No.: WO2020/237410
PCT Pub. Date: Dec. 3, 2020

(65) Prior Publication Data
US 2022/0148639 A1    May 12, 2022

(51) Int. Cl.
*G11C 11/4076*    (2006.01)
*G11C 11/4096*    (2006.01)

(52) U.S. Cl.
CPC ...... *G11C 11/4076* (2013.01); *G11C 11/4096* (2013.01)

(58) Field of Classification Search
CPC ............ G11C 11/4076; G11C 11/4096; G11C 29/023; G11C 29/021; G11C 2207/2254; G11C 29/028
See application file for complete search history.

(56) References Cited

U.S. PATENT DOCUMENTS 7,068,064 B1    6/2006   Yen
7,432,731 B2   10/2008   Bains et al.
(Continued)

FOREIGN PATENT DOCUMENTS

JP    2011528837 A    11/2011
JP    2016197275 A    11/2016

OTHER PUBLICATIONS

First Office Action for U.S. Appl. No. 15/721,516, dated Dec. 13, 2018, 8 pages.
(Continued)

*Primary Examiner* — Jerome Leboeuf
(74) *Attorney, Agent, or Firm* — Compass IP Law PC

(57) ABSTRACT

A reference voltage value and a chip select (CS) signal timing delay provided to memory devices can be determined based on samples of the CS signal received by the memory devices. The CS signal can be provided to the memory devices with varying time delays and for various reference voltages. Various samples of the CS signal from the memory devices can indicate different times for rising and falling edges of the CS signal. A composite signal eye can be generated by the latest occurring rising edge and the earliest occurring falling edge of the CS signal. The reference voltage value and timing delay can be chosen based on the composite signal eye width that is the closest to a reference eye width.

20 Claims, 8 Drawing Sheets

(56) References Cited

U.S. PATENT DOCUMENTS

| | | |
|---|---|---|
| 7,602,056 B2 | 10/2009 | Zhao et al. |
| 8,819,474 B2 | 8/2014 | Schoenborn et al. |
| 8,996,934 B2 | 3/2015 | Mozak et al. |
| 9,021,154 B2 | 4/2015 | Morris et al. |
| 9,025,399 B1 | 5/2015 | Morris et al. |
| 9,026,725 B2 | 5/2015 | Kostinsky et al. |
| 9,471,094 B1 | 10/2016 | Brahmadathan et al. |
| 9,558,850 B1 | 1/2017 | Bialas, Jr. et al. |
| 9,627,029 B2 | 4/2017 | Morris et al. |
| 10,148,416 B2 | 12/2018 | Morris et al. |
| 10,416,912 B2 | 9/2019 | Morris et al. |
| 11,061,590 B2 | 7/2021 | Morris et al. |
| 2006/0188045 A1 | 8/2006 | Nygaard |
| 2009/0110116 A1 | 4/2009 | Hollis |
| 2009/0244997 A1 | 10/2009 | Searles et al. |
| 2012/0257459 A1 | 10/2012 | Berke |
| 2013/0249107 A1 | 9/2013 | Jeon et al. |
| 2014/0181391 A1 | 6/2014 | Malladi et al. |
| 2014/0181392 A1 | 6/2014 | Malladi et al. |
| 2014/0281392 A1 | 9/2014 | Tuck et al. |
| 2017/0110165 A1 | 4/2017 | Kim et al. |
| 2017/0110169 A1 | 4/2017 | Kim et al. |
| 2018/0102150 A1 | 4/2018 | Choi et al. |
| 2018/0121123 A1 | 5/2018 | Morris et al. |
| 2018/0122486 A1 | 5/2018 | Choi et al. |
| 2019/0180805 A1* | 6/2019 | Ware .................. G06F 13/4234 |

OTHER PUBLICATIONS

First Office Action for U.S. Appl. No. 16/547,197, dated Sep. 25, 2020, 10 pages.

Notice of Allowance for U.S. Appl. No. 15/721,516, dated May 7, 2019, 10 pages.

Notice of Allowance for U.S. Appl. No. 16/547,197, dated Mar. 10, 2021, 7 pages.

Wikipedia, "Chip select", Oct. 31, 2017, 1 page, https://en.wikipedia.org/wiki/Chip_select.

Extended European Search Report for Patent Application No. 19931199.4, dated May 22, 2023, 8 pages.

Japanese and English Translation of Japanese First Office Action for Patent Application No. 2021-561883, dated Feb. 27, 2023, 6 pages.

International Search Report and Written Opinion for PCT Patent Application No. PCT/CN2019/088263, dated Feb. 14, 2020, 9 pages.

* cited by examiner

TRAINING FOR CHIP SELECT SIGNAL READ OPERATIONS BY MEMORY DEVICES

CLAIM OF PRIORITY

This application is a U.S. National Phase application under 35 U.S.C. § 371 of International Application No. PCT/CN2019/088263 filed May 24, 2029, entitled "TRAINING FOR CHIP SELECT SIGNAL READ OPERATIONS BY MEMORY DEVICES", the entire contents of which are incorporated herein by reference.

TECHNICAL FIELD

Various examples described herein relate to setting signal capture timing in memory devices.

BACKGROUND

Computing platforms or systems such as those configured as a server, personal computer, or other computing device may access dual in-line memory modules (DIMMs). DIMMs may include various types of memory including volatile or non-volatile types of memory. As memory technologies have advanced to include memory cells with higher and higher densities, memory capacities for DIMMs have also substantially increased. Also, advances in data rates for accessing data to be written to or read from memory included in a DIMM enable large amounts of data to flow between a requestor needing access and memory devices included in the DIMM. Numerous memory devices can be coupled to a bus with all the memory devices having the same command interface.

DETAILED DESCRIPTION

Figure 1A:
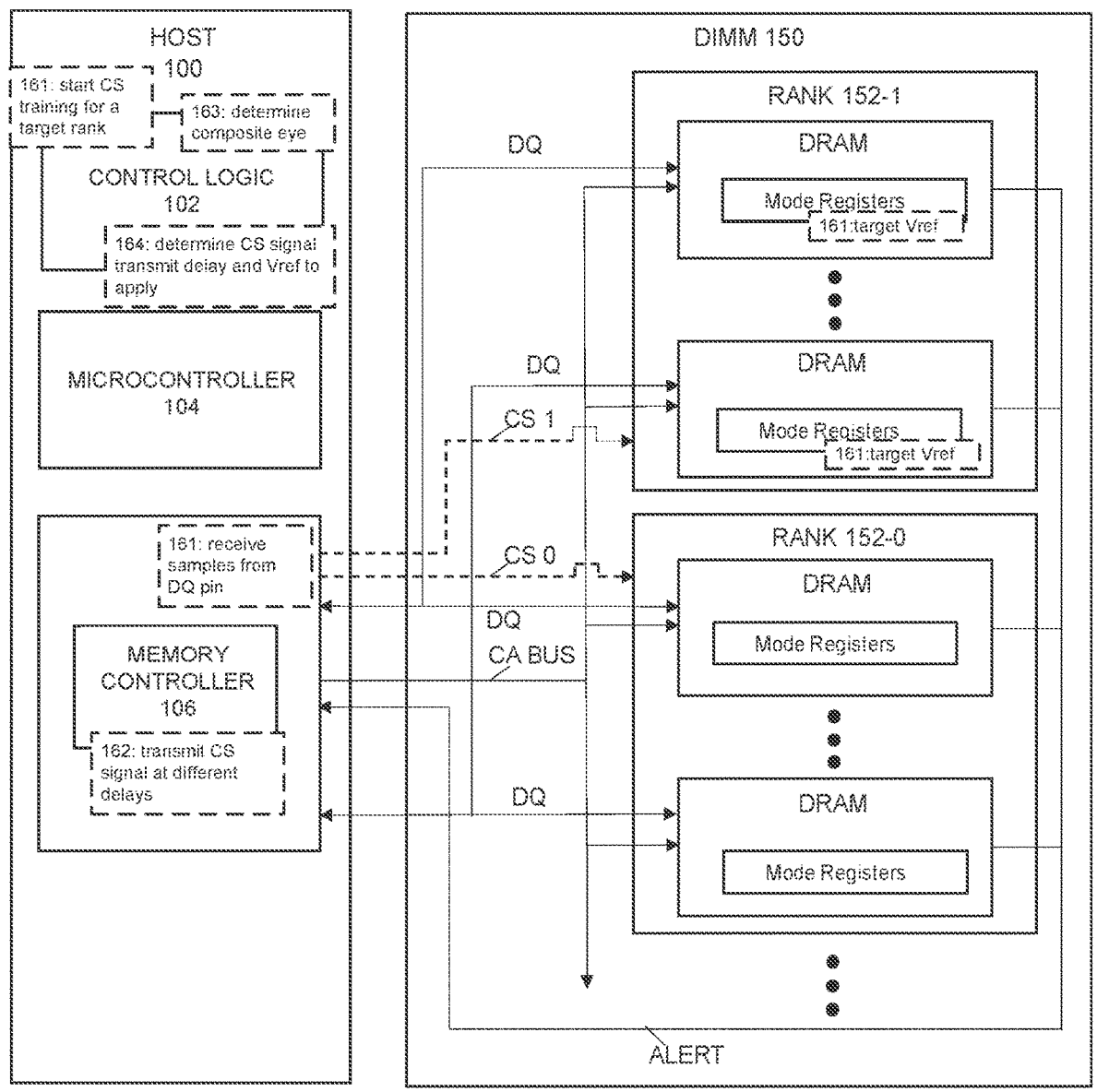
FIG. 1A depicts a block diagram of an example of a system with a host and memory module.

Currently, there are various types of DIMMs. For example, in a server, Registered DIMM (RDIMM) can be used and provide for buffering command address, control and clock before providing the signals to the memory devices. Load-Reduced DIMM (LRDIMM) use a buffer for data bus also in order to deal with loading of many ranks of memory devices. Unregistered DIMM (UDIMMs) are unbuffered DIMMs that do not have separate buffer before command address or data and communication can occur directly with memory devices.

DIMMs are coupled to a variety of interconnects and buses in order to enable communication with other devices such as a host device. The host device can issue commands to the DIMMs and receive responses from the DIMMs. For example, a data bus, command address bus, and control signal lines (e.g., chip select (CS) and clock (CLK)) can be used to provide communication between the host and DIMMs. The host can issue a chip select (CS) signal to qualify commands and indicate when a DIMM should "listen for" or read command address (CA) information from a C/A bus. CA information can include commands or addresses. Commands can include Write, Read, Row Activate, Row Precharge, Refresh, and Mode Register Write. With increasing signal rates, a small time region may be available between transitions of the CS signal for reading the CS signal.

Within a DIMM, characteristics of the memory devices (e.g., dynamic random access memory (DRAM)) can vary. For multiple memory devices, a chip select (CS) is sent to all memory devices. Because of different propagation delays, differences within the devices for when sampling begins after entering the CS training mode, and other causes, each memory device can experience a different timing of when a CS is received and also different timings of when memory devices receive clock signals. When a memory device is in a CS training mode, the memory device can sample the CS bus using the memory device's clock signal on every rising edge of the clock and take logical combination of 4 samples and send the sample feedback on a DQ bus to the host. But because of the different time of receipts of CS signals and clock signal, the sampled CS signals can be different for the memory devices. When a DIMM includes multiple memory devices, and the same CS signal is transmitted to the memory devices, the CS signal read by a memory device can differ. For example, signal propagation delays of the CS signal to various memory devices can differ. In addition, a clock signal used by a memory device to sample the CS signal can differ in phase or potentially frequency from a clock signal used by another memory device to sample the CS signal. For example, a CS signal stays high for 1 clock cycle and low for 1 clock cycle. Some of the memory devices have feedback that indicate a high value whereas other memory devices provide feedback that indicate the CS signal is low. Accordingly, different memory devices in a DIMM may misread the CS signal and fail to determine when to read C/A information or otherwise malfunction.

In a known solution for attempting to achieve accurate readings of the CS signal by memory devices using a clock signal, matched signal routings on a board were attempted to reduce variations in time of receipt of the CS signal by memory devices. Another known solution includes a receive enable method for Joint Electronic Device Engineering Council Double Data Rate 4 (JEDEC DDR4) compatible UDIMMs. For example, a receive enable (RCVEN) method for CS training is as follows: (1) host controller sends a Read Command, (2) host controller I/O samples when the strobes return for the read, and (3) repeat for all timing delays of CS to reveal when there is a cycle jump for the strobe return timing, or simply no strobes, and create a pass/fail scenario. Another known solution includes CS loopback mode for DDR4 register clock driver (RCD). RCD Loopback is a training mode in the RCD that was implemented for DDR4.

These solutions do not leverage the dynamic random access memory (DRAM) training mode capability and rely on the functional operation during training Functional training refers to using a normal functional command sequence to get feedback from the memory device, and not a special training mode. One example of functional training is the RCVEN training described above. The RCD has similar capability as receive enable mode but does not support multiple DRAM components.

JEDEC Committee JC42.3, Item Number: 1848.99D, DDR5 Full Spec Draft Rev0.83 provides a loopback function for training modes. Various embodiments provide a chip select (CS) training for one or more ranks of DDR5 compatible DRAMs (or other standards or volatile or non-volatile memory devices). A rank can include one or more memory devices. For example, various embodiments can be used in connection with LPDDR5 (LPDDR version 5), HBM2 (HBM version 2), and/or other older or newer technologies based on derivatives or extensions of such specifications. Various embodiments provide for providing CS signals to a rank with various timing offset values for one or a variety of applied reference voltage (Vref) values, determining transitions of the CS signal as read by memory devices of the rank, and selecting an applied Vref for the memory devices of the rank and a timing delay for the CS signal such that the memory device clock is centered within the CS signal assertion time. By providing a CS signal with varying timing offset amounts, various embodiments can learn when a memory device in a rank reads the active and inactive parts of the CS signal. Various embodiments provide one timing point used by the host that yields an accurate read of the CS signal by all memory devices in a rank. Accordingly, accuracy of reading CS signal by one or more ranks of memory devices can be potentially improved. Various embodiments can be executed by firmware, a Basic Input/Output System (BIOS) executed by a processor, and/or firmware on a microcontroller.

Various embodiments provide a process for changing a reference voltage (Vref) value as an outer loop of application of varying time delays to the CS signal to find a duty cycle and eye width for the CS signal. The Vref value is used to compare analog values read by a memory device to determine whether a 1 or 0 is transmitted. If at a sample, the memory device reads a value of the CS signal that is above the Vref, then the value is determined to be a one or asserted and otherwise determined to be a zero or unasserted.

Various embodiments can potentially improve CS training mode and determine the eye (e.g., eye width) for sampling a CS signal during CS training that is likely to lead to accurate reading of the CS signal by memory devices of a rank. Accordingly, a higher frequency (e.g., CS and clock signals) in DDR5 and other specifications can be used while allowing for correct reading and use of a CS signal by multiple memory devices in a rank.

FIG. 1A depicts a block diagram of an example of a system with a host and memory module. Various embodiments can be used in systems with a host and DIMMs (e.g., UDIMM, backside RCD with RDIMM, LRDIMM, or other DIMMs or arrangements of memory devices), or other types of volatile or non-volatile memory devices whether double data rate or not. Host 100 can access DIMM 150 using signal lines through a wired or wireless medium or interconnect.

Control logic 102 can determine a time delay to apply for transmitting or issuing a CS signal to a rank of memory devices. Control logic 102 can determine a Vref to be applied by a rank of memory devices. Control logic 102 can be implemented as one or more of: firmware, BIOS executed by a processor, and/or firmware on microcontroller 104. Memory controller 106 can issue CS commands to a rank of memory devices (e.g., rank 152-0 or 152-1). More of fewer ranks of memory devices can be used. An example sequence of operations is described next for host 100 to determine a CS signal transmit delay and Vref value. For example, control logic 102 can cause the system to perform one or more of the actions 161-164. In other examples, DIMM 150 can be programmed to determine either or both of the CS signal transmit delay or Vref value.

At 161, memory controller 106 is to start CS training for a target rank of memory devices. For example, memory controller 106 can apply a target Vrefn in a DRAM mode register for use by a rank of memory devices, enable the CS training mode for the rank, transmit the CS signal for various transmit delay values, and receive the training feedback via the DQ pin. In this example, rank 152-1 has CS training applied. Vref can be changed by sending a low frequency command that does not require the CS to be trained and using the same command and CS interfaces, but multiple clock cycles to capture the command to change Vref.

At 162, for the same rank, memory controller 106 is to cause transmission of a CS signal at various transmit time delay values (e.g., 0 to X, at an increment of $\frac{1}{128}$ tCK) to a rank of memory devices. For an applied Vref value, various transmit time delays can be applied to transmission of the CS signal to a rank of memory devices. The Vref value can be changed to a different value and various transmit time delays can be applied to transmission of the CS signal to a rank of memory devices.

At 163, for some or all applied Vref values, determine a composite eye based on the training feedback for the CS signal sent at various transmit delays and the applied Vref values. The composite eye can be determined by samples of the CS signal feedback from multiple memory devices. The composite eye can account for the differences during sampling cycles across different memory devices in the rank. A composite eye can be determined based on a latest occurring (in time) rising edge (e.g., left edge) and an earliest occurring (in time) falling edge (e.g., right edge) selected from the CS signal samples from the multiple memory devices. The composite eye can represent a region in which CS signal transitions are not measured by any memory device in a rank and can represent a region that there is low likelihood of mis-interpreting a CS signal as the CS signal is not likely to change during the composite eye.

At 164, select transmit delay of the CS signal and a Vref to apply in a rank based on the transmit delay and Vref whose composite eye is closest to an ideal or reference eye width. For example, action 164 can include calculating the absolute difference between various composite eye widths (for different Vref values) and a CS unit interval (UI). A representation of the calculation can be as follows.

Eye Width Offset(CA *Vrefn*)=|Eye Width(CS *Vrefn*)− CS UI|, where:

CS UI can be an ideal or reference eye width as specified in JEDEC DDR5, although other ideal or reference eye widths can be used. Action 164 can also include calculate the sum of multiple (e.g., three or other number) Vref position's eye width offset. Summing several (e.g., 3 or another number) eye width offset values can average out the impacts of noise for any single measurement as a way of filtering across the measurements for multiple Vref levels that are expected to be similar. Example manners of how to determine the eye width offset are described later.

Figure 1B:
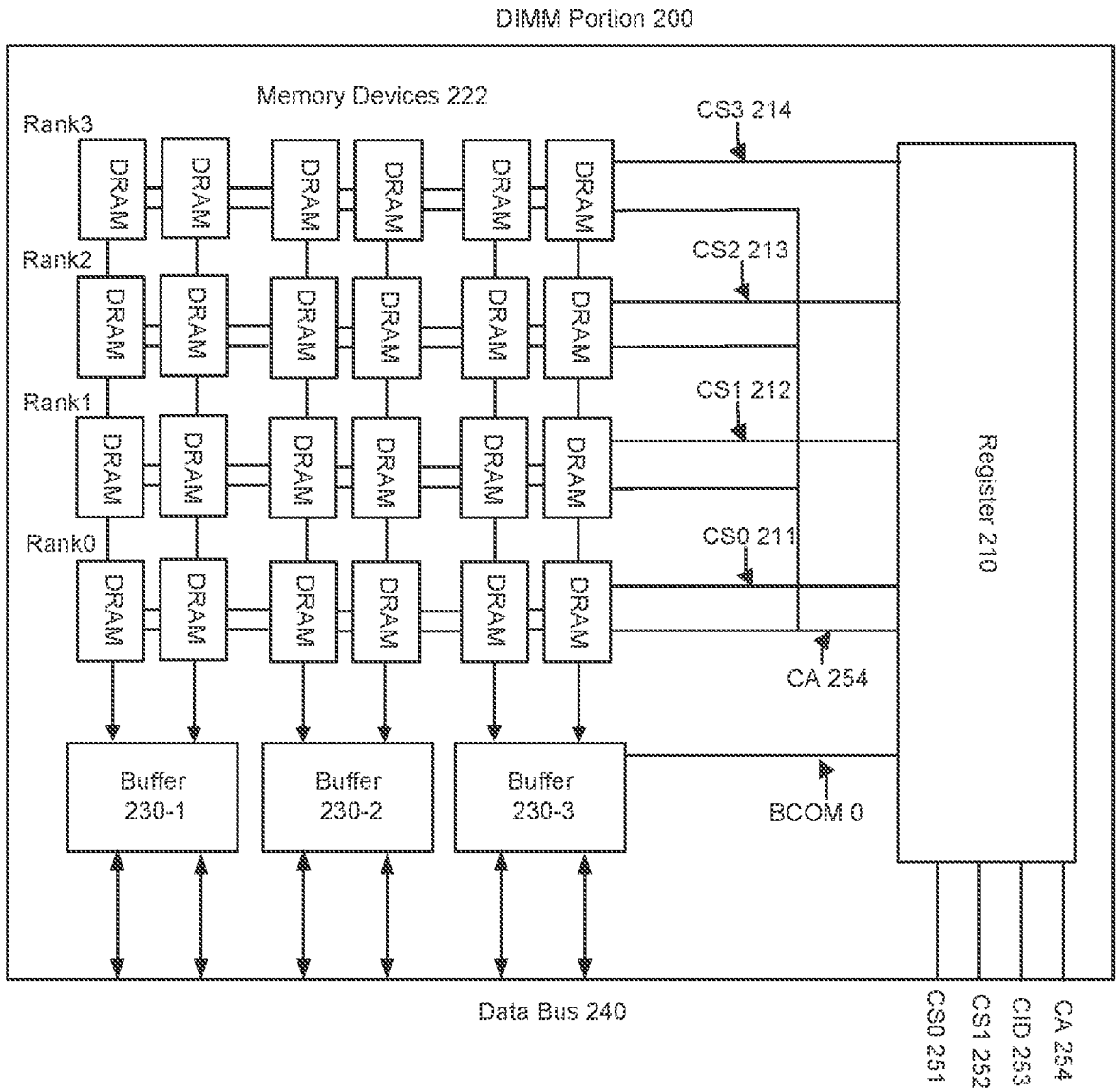
FIG. 1B illustrates an example of a dual in-line memory module (DIMM) portion.

FIG. 1B illustrates an example of a DIMM portion 200. In some examples, DIMM portion 200 may represent a first side of two sides of a DIMM arranged as an LRDIMM supported by a single register such as register 210. A full DIMM may include an equal number of memory devices 222 and buffers 230-1 to 230-3 on a second side or back side. Examples are not limited to DIMMs arranged in an LRDIMM configuration having buffers 230-1 to 230-3. In other examples, other types of DIMM configurations such as, but not limited to, an RDIMM configuration may be applicable.

According to some examples, buffers 230-1 to 230-3 may be data buffers controlled by logic and/or features of register 210 to route data associated with requests for access or control of memory devices 222 via a BCOM 0 bus based on commands received from a host computing device (not shown) responsive to various signals received from the host computing device. For these examples, at least a portion of the signals from the host computing device may be received by register 210 via chip select (CS) CS0 251, CS0 252, chip identification (CID) 253 or command/address (CA) 254. For these examples, each memory device included in memory devices 222 may be a DRAM memory device and may be coupled with respective buffers 230-1 to 230-3 via a 4 bit (b) data bus. Buffers 230-1 to 230-3 may transfer data to the host computing device via data bus 240 or may be caused to have internal resistance terminations (RTTs) when respective memory devices coupled to these buffers are not being accessed. Examples are not limited to DRAM memory devices or to a 4b data bus. Different memory devices having different sized data buses such as 8b are contemplated. Also, examples are not limited to ten memory devices per rank or to a total number of five buffers per side of a DIMM. Examples are also not limited to a DIMM having a total of 4 ranks. In some examples 2, 3 or more than 4 ranks are contemplated.

According to some examples, memory devices 222 may be arranged in multiple ranks shown in FIG. 1B as Rank0, Rank1, Rank2 or Rank3. Rank0, Rank1, Rank2 or Rank3 may be controlled or accessed based on respective active CSs outputted from register 210 via CS0 211, CS1 212, CS2 213 and CS3 214 as well as CA signals outputted from register 210 via CA 254. In some examples, register 210 may include logic and/or features to determine which ranks to access or control based on signals received via CS0 251, CS0 252, CID 253 or CA 254 from a host computing device (e.g., a host controller). Also, this logic may include CKE encoding to allow a broadcast of certain commands received from the host computing device (e.g., a power down command) to all ranks or may include ODT encoding for a DIMM to determine whether or not to terminate or cause RTTs on either a device or host side of data bus 240.

Figure 2A:
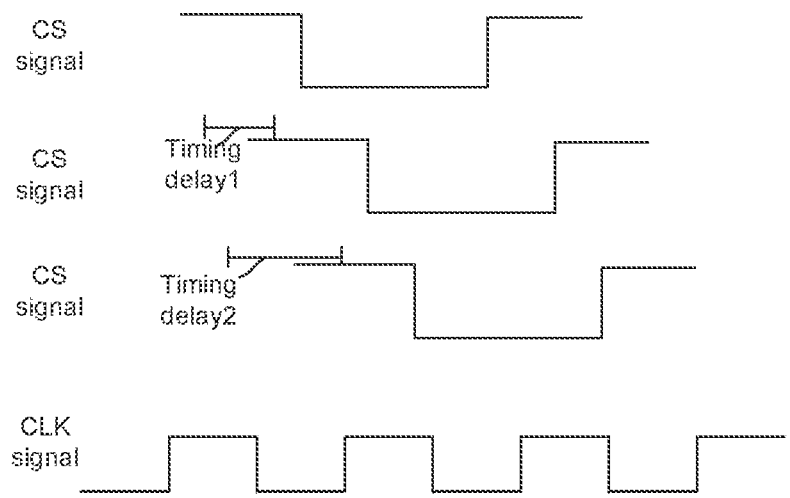
FIG. 2A depicts an example of a chip select (CS) signal that is transmitted at varying transmission delay values.

FIG. 2A depicts an example of a CS signal that is transmitted at varying transmission delay values. Actual sampling of the CS signal by the CLK may be due to a special training mode that is enabled in the memory device. The feedback to the host of this sample can be a logical combination of several samples and can be sent via the data bus back to the host. Multiple memory devices in a DIMM can receive the CS signal at varying timing delay amounts, sample the CS signal, and provide the samples to the host. The host can determine a CS signal measured by the memory device based on the samples.

Figure 2B:
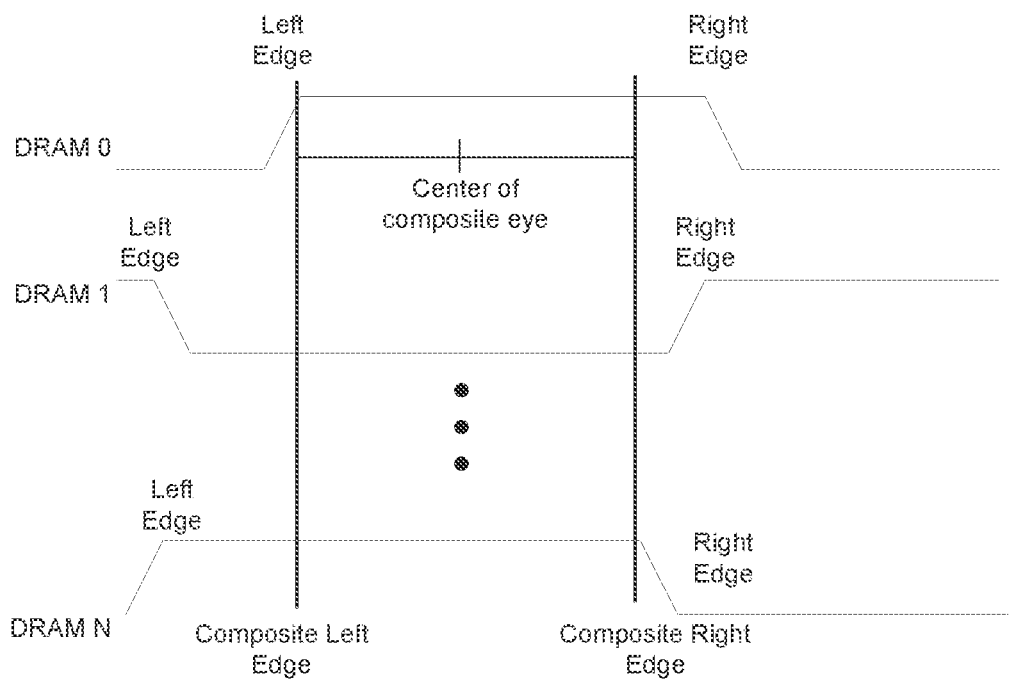
FIG. 2B depicts a composite eye determination from signal transitions of multiple samples.

FIG. 2B depicts an example of a composite eye from samples of a CS signal based on the CS signal transmitted at varying time delay amounts. For example, DRAM 0 to DRAM N of a rank can receive a transmitted chip select (CS) signal. A host device can send the CS signal at increasing levels of transmit delay levels from zero to a maximum level. DRAM 0 to DRAM N can provide samples of the received CS signal at the varying transmit delay levels to the host. For a particular applied Vref value, the waveforms shown in FIG. 2 indicate the active and inactive regions of the CS signal as sampled by the DRAM 0 to DRAM N and feedback to the host. For example, signal DRAM 0 can represent samples of the CS signal using a clock signal. Likewise, samples taken by DRAM 1 and DRAM N can represent samples of the CS signal using a clock signal. At least because of the difference in signal propagation and applied clock signals, the samples show that CS signal measured by DRAM 0 to N are offset from one another.

For an applied Vref, a composite eye can be determined as a last occurring rising (e.g., left) edge and earliest occurring (e.g., right) falling edge for the CS signals sampled for all DRAMs in the rank. The composite eye can be used by a host to determine an offset to the center of the composite eye. The offset to the center of the composite eye can be used as a transmit delay at which the host transmits the CS signal to one or more memory devices (e.g., DRAMs) of a rank for a particular applied Vref value. A single location can be determined that the CS timing will work for all DRAMs in a rank based on transitions of sampled CS signals from DRAM 0 to DRAM N. The center of the composite eye represents a point at which the CS signal is likely to be read correctly by all DRAM devices in a rank. The timing offset can be determined for each or some of the ranks. Multiple CS signals can be sent to different ranks of DRAMs, each with determined CS signal transmit delay offsets of zero or more.

Figure 3:
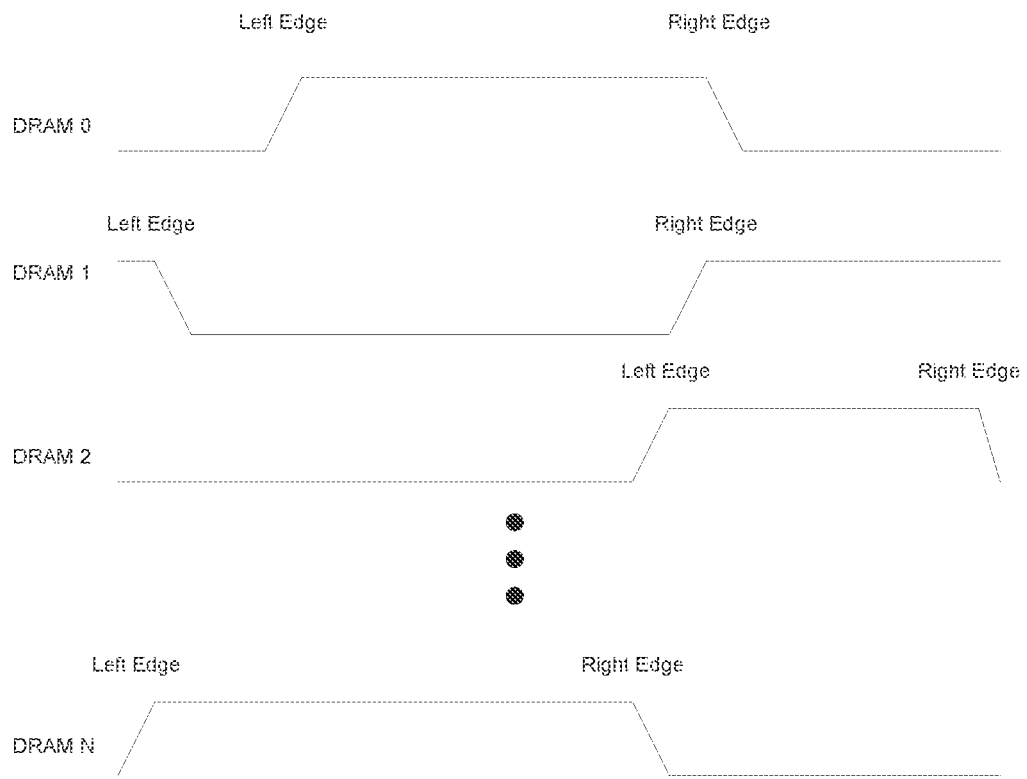
FIG. 3 depicts examples of CS signal samples where one CS signal is subsequently modified to form a composite signal.

FIG. 3 depicts examples of CS signal samples where one CS signal is to be modified to form the correct composite signal. As in the example of FIG. 2B, a DRAM provides samples of a CS signal with various applied transmit offsets. In the case of DRAM 2, the left edge (rising) of the sampled CS signal is offset relative to the left edge of sampled CS signals of other DRAM devices. For example, if a distance of a left edge of an earliest in time rising edge of a CS signal to a rising edge of another sampled CS signal is larger than a threshold, then the another sampled CS signal can be modified so that the left (rising) edge is changed to a right (falling) edge and a new left (rising) edge is calculated. Pseudocode to determine whether to modify left and right edges can be as follows.

```
If (DRAM N's left edge − minimum left edge) > (minimum left edge −
(DRAM N's right edge − 2 CS UI))) {
    DRAM N's new left edge = DRAM N's right edge − 2 CS UI
    DRAM N's new right edge = DRAM N's left edge
}
```

The minimum (left most) left edge of the sampled CS signals from the DRAM devices in a rank is determined. If the DRAM device N's eye left edge minus the minimum left edge is greater than the minimum left edge minus the value of DRAM device N's eye right edge minus 2 CS UI, then, for this device, the right edge is changed to its current left edge, and the left edge will be the value of its current right edge minus 2 CS UI. 2 CS UI can represent a reference eye width (e.g., distance between signal transitions). To determine the composite eye for the rank for an applied Vref value, the maximum (right most) left edge and minimum (left most) right edge of all the DRAM devices.

Figure 4:
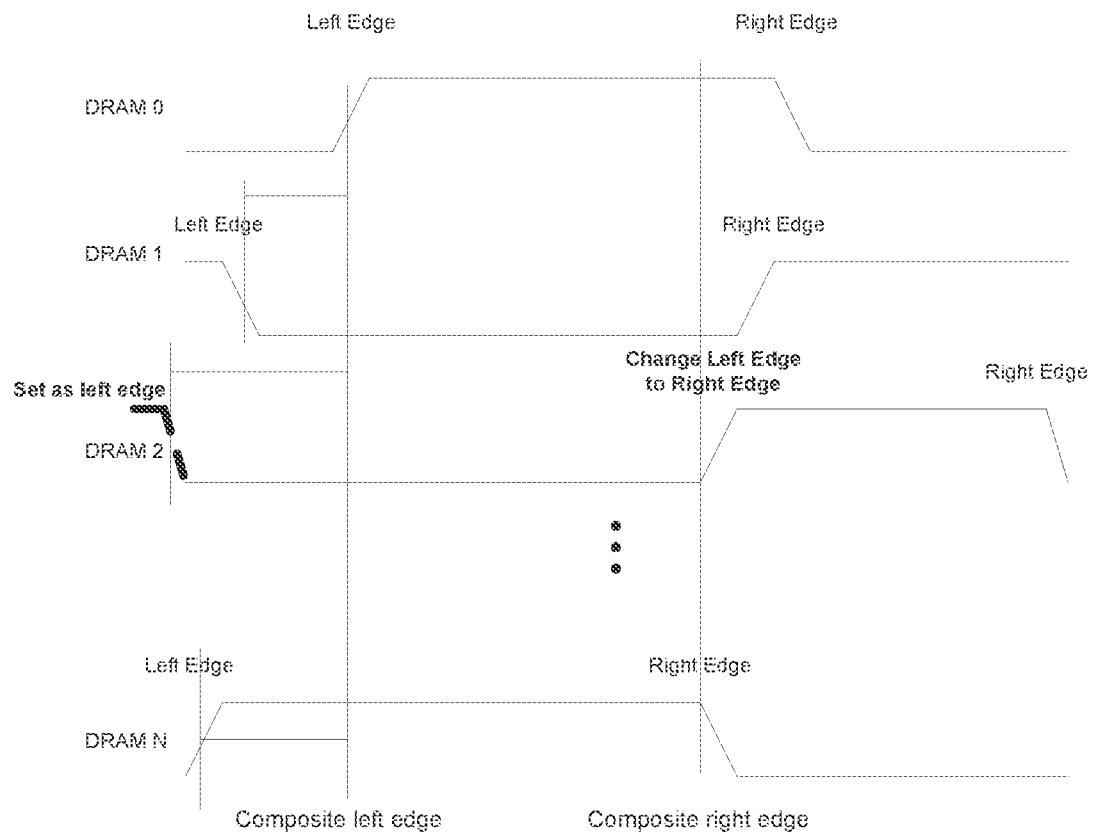
FIG. 4 depicts a composite eye calculation after modification of a sampled signal.

FIG. 4 depicts a composite eye calculation after modifying a left edge and right edge of a signal. In this example, the left and right edges of the sampled CS signal for DRAM 2 are determined and used to determine the composite signal.

The composite left and right edges are selected as the latest (in time) left (rising) edge and earliest (in time) right (falling) edge.

Figure 5A:
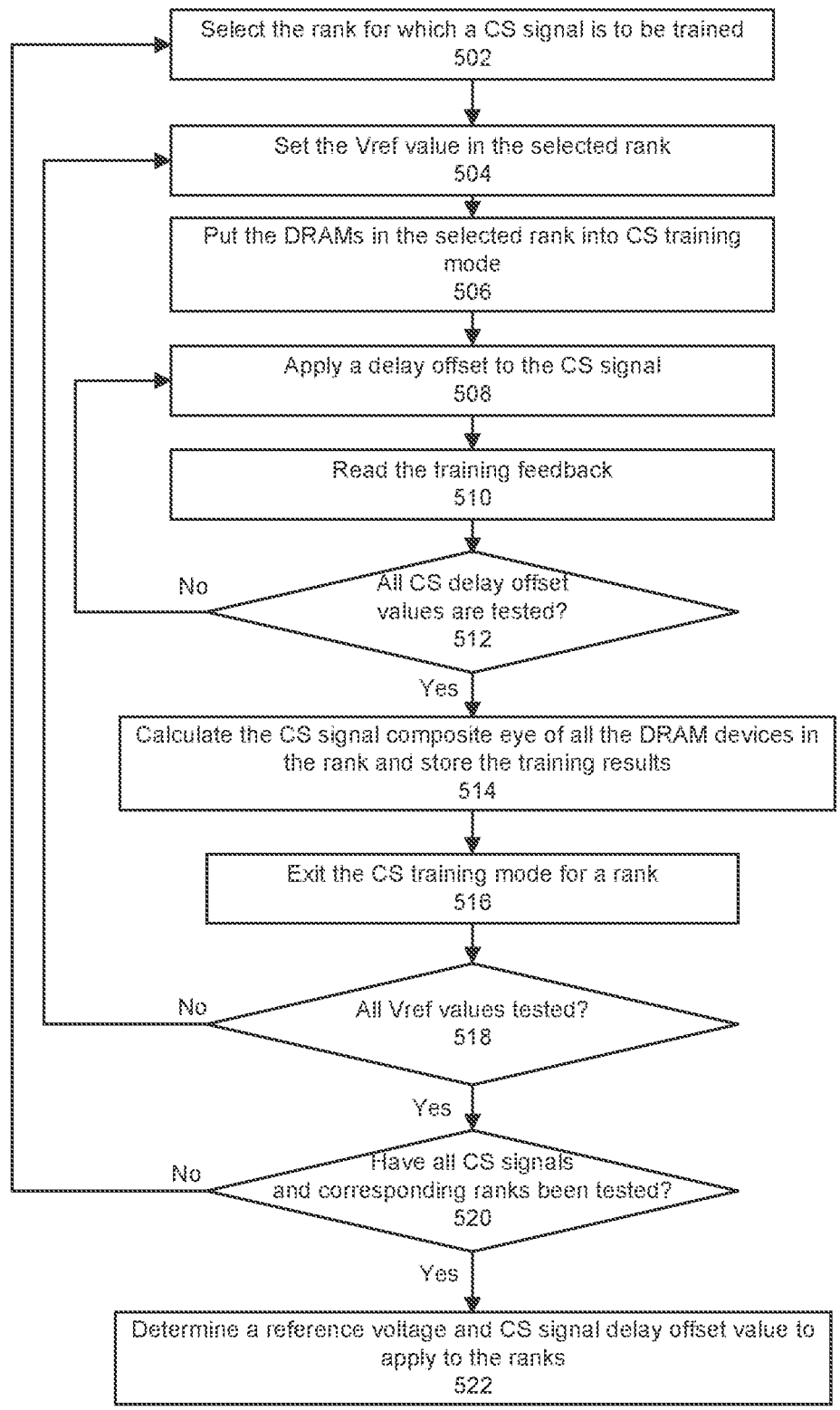
FIGS. 5A and 5B depict processes that can be used to determine transmit delay for a chip select signal and reference voltage for a rank of memory devices.
Figure 5B:
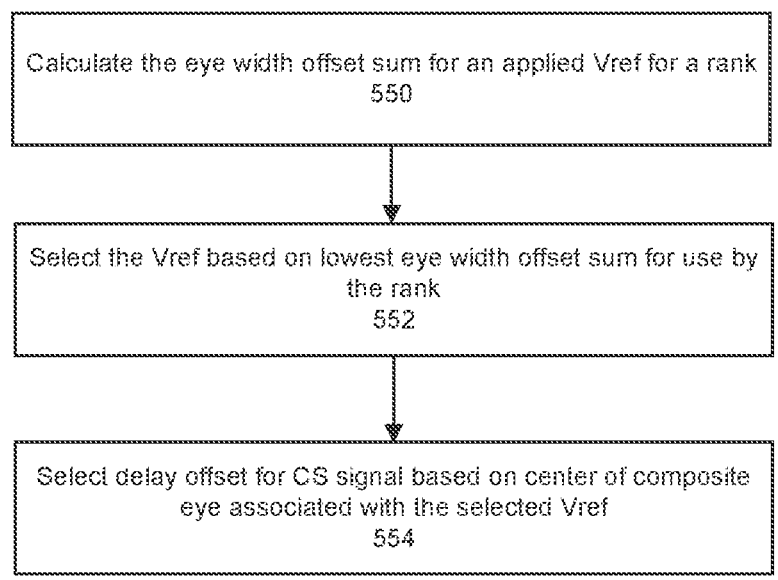

FIGS. 5A and 5B depict processes that can be used to determine transmit delay for a chip select signal and reference voltage for a rank of one or more memory devices. The process can be used by a host to determine a delay to apply to transmission of a CS signal to a rank of one or more DRAM devices. Other types of volatile or non-volatile memory can be included in a rank including one or more of a cache, static random access memory (SRAM), NAND, 3D NAND, or memory such as Intel® Optane or Samsung® Z-NAND. The process can also be used to determine a reference voltage (Vref) to use by a rank of memory devices. A determined delay for a rank can be determined by application of one or more Vref values and transmission of CS signals to the rank at varying offset values. The reference voltage and delay, whose eye width offset sum is closest to a reference eye width can be chosen used for chip select signal transmission to the rank. The delay can be selected as a mid-point of the eye timing center.

At 502, selection is made of the rank for which a chip select (CS) signal is to be trained. For example, the rank with the lowest identifier or index can be selected first. For example, rank0 can be selected first and the rank0 can have a corresponding chip select signal of CS0. A rank can be a group of one or more DRAM devices that are accessed (e.g., read from or written to) at the same time.

At 504, the Vref value for the selected rank is set. The Vref value can be set by a selection from a group of Vref values. The Vref can be a reference voltage used by a memory device to differentiate 0 or 1 values when sampling a received CS signal.

At 506, DRAM devices of the selected rank are placed into CS training mode. An example of a CS training mode is described in JEDEC DDR5 specification. To place one or more DRAM devices of a rank into CS training mode, a host can send a Multi-Purpose Command (MPC) to the rank to put the rank into CS training mode.

At 508, a delay offset is applied to the CS signal before transmission to the selected rank. For example, a first delay offset can be zero, and subsequent delay offsets can increment by 1/128 tCK, where tCK represents a clock cycle. For example, a frequency per tCK can be 1600 MHz, tCK=625 ps; 2000 MHz, tCK=500 ps; or 3200 MHz, tCK=312.5 ps.

At 510, the training feedback from the transmitted CS signal is read. According to JEDEC DDR5, the rank sends 4 samples of the CS signal to the host using a DQ line. JEDEC DDR5 Full Spec Draft Rev0.83, FIG. 81 and Table 97 describe a manner to interpret the samples to determine a value of the CS signal. For example, the determined value for a CS signal transmitted using an applied delay offset can be used to construct a portion of a sampled CS signal and multiple samples determined across multiple applied delay offsets can be used to construct a sampled CS signal. An example of a sampled CS signal is shown in FIG. 2B.

At 512, a determination is made as to whether all CS signal delay offset values have been tested. For example, for a first iteration of 508-510, a first delay offset is applied to the CS signal and if another delay offset is available to test, then 508 can follow 512. For example, if all available delay offset values have been tested, then the process continues to 514.

At 514, the process calculates the CS signal composite eye of all the DRAM devices in a rank and stores the training results. A CS signal composite eye can be determined for a particular reference voltage value (Vref) across all available delay offset values applied to the CS signal. For example, for an applied Vref value, the CS signal composite eye can be determined based on a last occurring rising (e.g., left) edge and earliest occurring (e.g., right) falling edge for the CS signals sampled for all DRAM devices in the rank. An example manner to determine a composite eye is described with respect to FIG. 2B.

At 516, the process exits the CS training mode for a current rank. For example, to exit CS Training Mode for a rank, a host can send an MPC command to the rank to disable CS Training Mode.

At 518, the process is to determine whether all reference voltage (Vref) values have been applied to DRAM devices of the rank. If all reference voltage values have not been tested for the current rank, the process proceeds to 504 where a next reference voltage value is selected and applied for a next iteration of 506-516. If all reference voltage (Vref) values have been tested for the rank, then the process continues to 520. In some examples, a single Vref value can be used and not varied for different CS delay offset values applied to memory devices in a rank.

At 520, the process determines whether all CS signals and corresponding ranks have been tested using all available reference voltage values and available delay offset values. If all CS signals and corresponding ranks have been tested using all available reference voltage values and available delay offset values, then the process continues to 522. If CS signals and corresponding ranks have not been tested using all available reference voltage values or available delay offset values, the process returns to 502.

At 522, determinations are made as to the reference voltage (Vref) and delay offset value to apply for each CS signal provided to a rank. For example, a Vref0 and delay0 can be applied for rank0, a Vref1 and delay1 can be applied for rank1, and so forth. In some examples, a suitable process determines the reference voltage (Vref) and delay offset value to apply for each CS signal transmitted to a rank. Action 522 can include one or more of actions 550-554 described with respect to FIG. 5B.

FIG. 5B depicts a process that can be used to determine a reference voltage (Vref) and delay offset value to apply for each CS signal transmitted to a rank. The process of FIG. 5B can be repeated for available ranks in a DIMM. At 550, the process calculates an eye width offset sum for various applied reference voltage values for a rank. An eye width can be distance between composite right edge and composite left edge of a composite eye determined for an applied reference voltage for the rank. An eye width offset can be determined as:

eye width offset=eye width−(2 UI), where 2 UI is 128 PI.

In some examples, 2 UI is an ideal or reference eye width value according to JEDEC DDR5 specification. In some examples, an ideal eye width is a single memory clock cycle for DDR enabled memory. The eye width offset can be determined in the following manner.

If the Vrefn is not the first Vref (e.g., first Vref is lowest Vref value) or the Vrefn is not the last Vref (e.g., the last Vref can be the highest Vref value) to test in the training step, then Eye width offset sum ($Vref_n$)=Eye Width Offset ($Vref_{n-1}$)+Eye Width Offset ($Vref_n$)+Eye Width Offset ($Vref_{n+1}$), where:

Eye Width Offset ($Vref_{n-1}$) is the eye width offset of the Vref that is the previous tested Vref prior to use of Vrefn and Eye Width Offset ($Vref_{n+1}$) is the eye width offset of the Vref that is the next tested Vref after use of Vrefn.

However, if the Vrefn is the first tested Vref (e.g., lowest Vref value), then

Eye Width Offset Sum (*Vrefn*)=Eye Width Offset (*Vrefn*)+Eye Width Offset (*Vrefn*)+Eye Width Offset (*Vrefn*+1).

If the Vrefn is the last tested Vref (e.g., highest Vref value), then

Eye Width Offset Sum (*Vrefn*)=Eye Width Offset (*Vrefn*−1)+Eye Width Offset (*Vrefn*)+Eye Width Offset (*Vrefn*).

Averaging across 3 Vref values can account for the fact that at the edges of the Vref range, there is an assumption that the measurement is the same across the boundary. Instead of dividing all of these by 3, use the integer values and find the lowest offset, or Vref, that produces the closest to 50% duty cycle for a toggling 0-1-0-1 pattern.

At 552, the process selects the Vref whose eye width offset sum is the lowest value or whose composite eye width is closest to the 2 UI value (or other prescribed measurement) as the Vref for use by the rank. The Vref value can be programmed for use by DRAM devices of the rank.

At 554, the process selects the delay offset for the CS signal based on center of composite eye associated with the selected Vref. The center of the composite eye can be set as the timing delay of the CS signal for the rank the center of the composite eye where the composite eye is associated with the selected Vref. For example, a mid-point time of the left and right edges of the composite edges of the Vref can be selected for use as a timing delay for a CS signal for the rank. The host can store the timing offset for use in delaying the CS signal for transmission to the rank when a CS signal is to be transmitted to a rank of memory devices. In some cases, the timing offset is zero.

Figure 6:
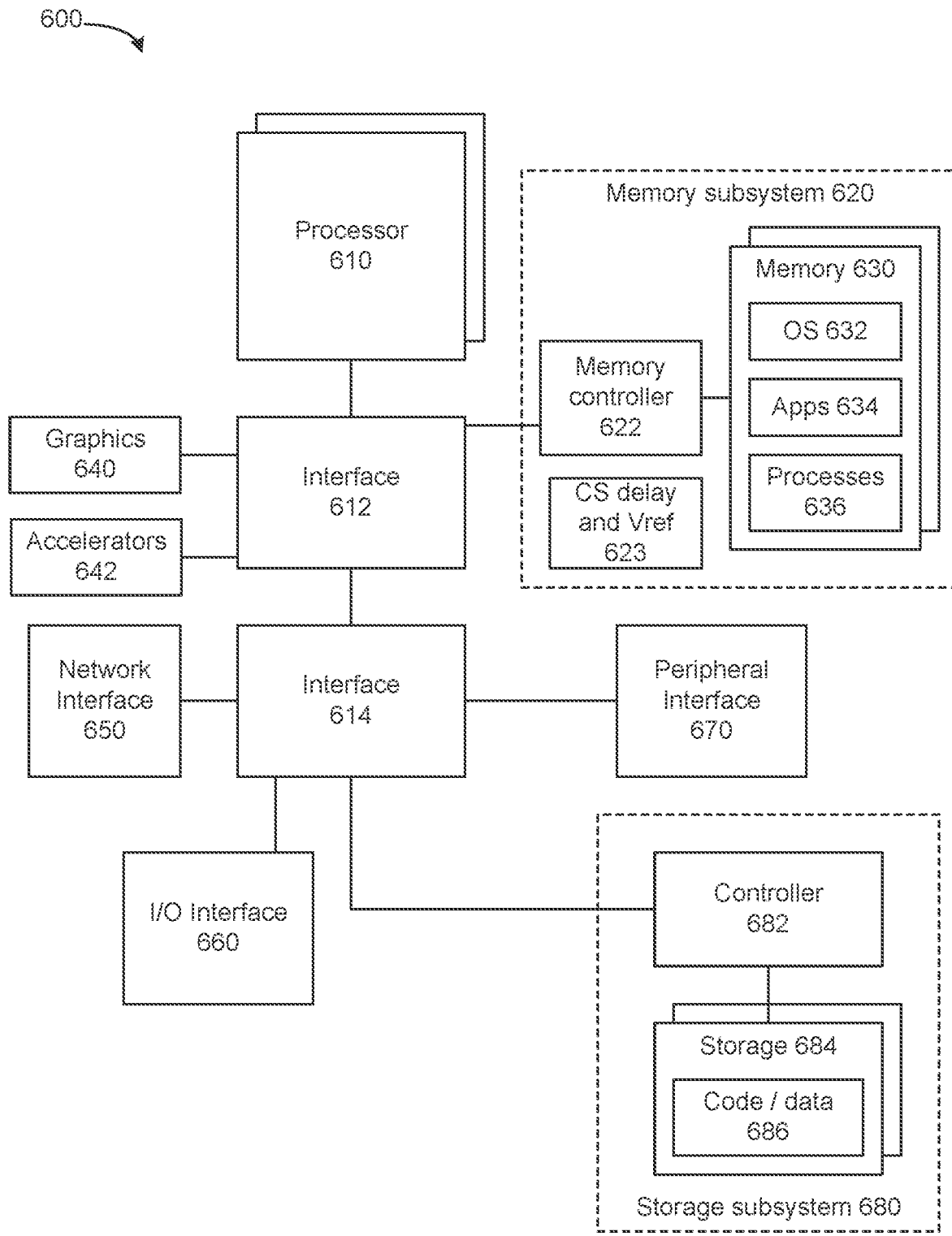
FIG. 6 depicts a system.

FIG. 6 depicts a system. The system can use embodiments described herein to determine a reference voltage to apply to a rank of memory devices and a timing delay of a chip select (CS) signal sent to the rank of memory devices. System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein. In some cases, accelerators 642 can be integrated into a CPU socket (e.g., a connector to a motherboard or circuit board that includes a CPU and provides an electrical interface with the CPU). For example, accelerators 642 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 642 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, volatile memory, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

For example, various embodiments can use a CS delay and Vref logic 623 to determine a CS signal delay and Vref to apply by a rank of one or more memory devices in memory 630.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 600 includes interface 614, which can be coupled to interface 612. In one example, interface 614 represents an interface circuit, which can include stand-alone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data 686 in a persistent state (i.e., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (i.e., the value or state of the data is indeterminate if power is interrupted to system 600). In one example, storage subsystem 680 includes controller 682 to interface with storage 684. In one example controller 682 is a physical part of interface 614 or processor 610 or can include circuits or logic in both processor 610 and interface 614.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented using interconnected compute sleds of processors, memories, storages, network interfaces, and other components. High speed interconnects can be used such as PCIe, Ethernet, or optical interconnects (or a combination thereof).

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (i.e., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Example 1 includes a host system comprising: a processor and a memory controller coupled to the processor, the memory controller to: request a first reference voltage is applied by memory devices; during use of the first reference voltage by the memory devices: transmit, to the memory devices, a chip select (CS) signal after various delay amounts and receive, from the memory devices, samples of the CS signal transmitted after the various delay amounts; request a second reference voltage is applied by the memory devices; during use of the second reference voltage by the memory devices: transmit, to the memory devices, the CS signal after various delay amounts; and receive, from the memory devices, samples of the CS signal transmitted after the various delay amounts, wherein the processor is to determine a reference voltage for the memory devices based on a reference voltage that provides a composite eye width that is closest to a reference eye width and determine a delay to transmit a CS signal based on the composite eye width.

Example 2 includes any example, wherein the processor is to determine a composite eye for an applied reference voltage based on sampled CS signals from multiple memory devices for multiple applied CS signal transmit delays.

Example 3 includes any example, wherein: the processor is to determine a first composite eye based on rising and falling edge of the samples of the CS signals transmitted after the after various delay amounts and during use of the first reference voltage by the memory devices; the processor is to select a latest rising edge and earliest falling edge for the first composite eye; the processor is to determine a second composite eye based on rising and falling edge of the samples of the CS signals transmitted after the various delay amounts and during use of the second reference voltage by the memory devices; the processor is to select a latest rising edge and earliest falling edge for the second composite eye; and the processor is to select the reference voltage, from among that first and second references voltages, associated with the composite eye, from among the first and second composite eyes, that is closest to a reference eye width.

Example 4 includes any example, wherein: the processor is to select the transmit delay as a time to a middle of the composite eye width associated with the selected reference voltage.

Example 5 includes any example, wherein the reference eye width comprises a memory clock cycle.

Example 6 includes any example and comprising the memory devices and wherein the memory devices comprise a rank of dynamic random access memory (DRAM) devices.

Example 7 includes any example, wherein the processor is to commence a CS signal training scheme compatible with Joint Electronic Device Engineering Council Double Data Rate 5.

Example 8 includes any example, wherein in an event that samples of the CS signal include a rising edge that is greater than a threshold distance from an earliest rising edge, the processor is to set the samples of the CS signal to provide a falling edge in place of the rising edge.

Example 9 includes any example, wherein the memory controller is to apply the determined offset prior to transmission of the CS signal and the memory controller is to cause the memory devices to apply the determined reference voltage.

Example 10 includes a method comprising: starting a chip select (CS) training mode for a rank of memory devices; setting a first reference voltage value for use by the memory devices; during use of the first reference voltage, transmitting a CS signal to the rank at various time delay amounts; receiving samples of the CS signal having the various time delay amounts from the memory devices; determining a first composite eye based on a latest occurring rising edge and an earliest occurring falling edge of the samples from use of the first reference voltage; setting a second reference voltage value for use by the memory devices; during use of the second reference voltage, transmitting a CS signal to the rank at various time delay amounts; receiving samples of the CS signal associated with use of the second reference voltage and various time delay amounts from the memory devices; determining a second composite eye based on a latest occurring rising edge and an earliest occurring falling edge of the samples from use of the second reference voltage; selecting a composite eye that is closest to a reference eye width; selecting a reference voltage associated with the selected composite eye; and determining a delay for transmission of the CS signal based on a midpoint of the composite eye.

Example 11 includes any example, wherein the reference eye width comprises a memory clock cycle.

Example 12 includes any example, wherein the rank comprises a rank of dynamic random access memory (DRAM) devices.

Example 13 includes any example, wherein the CS signal training mode is compatible with Joint Electronic Device Engineering Council Double Data Rate 5.

Example 14 includes any example and comprising: determining that samples of the CS signal include a rising edge that is greater than a threshold distance from an earliest rising edge and setting the samples of the CS signal to provide a falling edge in place of the rising edge.

Example 15 includes any example and comprising: applying, by a memory controller, the selected reference voltage and applying, by the memory controller, the determined offset prior to transmission of the CS signal.

Example 16 includes any example and comprising: starting a chip select (CS) training mode for a second rank of memory devices; setting a first reference voltage value for use by the second rank of memory devices; during use of the first reference voltage by the second rank of memory devices, transmitting a CS signal to the second rank of memory devices at various time delay amounts; receiving samples of the CS signal having the various time delay amounts from the memory devices from use of the first reference voltage by the second rank of memory devices; determining a first composite eye based on a latest occurring rising edge and an earliest occurring falling edge of the samples from use of the first reference voltage by the second rank of memory devices; setting a second reference voltage value for use by the second rank of memory devices; during use of the second reference voltage by the second rank of memory devices, transmitting a CS signal to the rank at various time delay amounts; receiving samples of the CS signal having the various time delay amounts from the memory devices from use of the second reference voltage by the second rank of memory devices; determining a second composite eye based on a latest occurring rising edge and an earliest occurring falling edge of the samples from use of the second reference voltage by the second rank of memory devices; selecting a second composite eye that is closest to a reference eye width; selecting a second reference voltage associated with the selected composite eye; and determining a delay for transmission of the CS signal based on a midpoint of the second composite eye.

Example 17 includes a system comprising: a host system comprising a processor, a memory controller, and memory devices, wherein the memory devices are coupled to the processor, wherein: the processor is to cause application of one or multiple reference voltages by the memory devices and transmission of a chip select (CS) signal delayed at multiple delay times during use of one or more of the reference voltages; the processor is to receive samples of the CS signal from memory devices; the processor is to determine a composite eye based on the samples for at least one of reference voltages; the processor is to select a reference voltage associated with a composite eye that is closest to a reference eye width; and the processor is to select a delay time prior to transmission of the CS signal based on a time offset to a middle of the composite eye that is closest to a reference eye width.

Example 18 includes any example, wherein the host system comprises a personal computer, smart phone, blade, rack, or server.

Example 19 includes any example, wherein the reference eye width comprises 2 UI (unit intervals).

Example 20 includes any example, wherein the processor is to start a CS training mode based on Joint Electronic Device Engineering Council Double Data Rate 5.

What is claimed is:

1. A host system comprising:
a processor; and
a memory controller coupled to the processor, the memory controller to:
request a first reference voltage to be applied by memory devices;
during use of the first reference voltage by the memory devices:
transmit, to the memory devices, a chip select (CS) signal after various delay amounts and
receive, from the memory devices, samples of the CS signal transmitted after the various delay amounts;
request a second reference voltage to be applied by the memory devices;
during use of the second reference voltage by the memory devices:
transmit, to the memory devices, the CS signal after various delay amounts; and
receive, from the memory devices, samples of the CS signal transmitted after the various delay amounts, wherein the processor is to determine a reference voltage for the memory devices based on the first and second reference voltages that provides a composite eye width that is closest to a reference eye width and determine a delay to transmit a subsequent CS signal based on the composite eye width.

2. The host system of claim 1, wherein the processor is to determine a composite eye for an applied reference voltage based on sampled CS signals from the memory devices for multiple applied CS signal transmit delays.

3. The host system of claim 1, wherein:
the processor is to determine a first composite eye based on rising and falling edges of the samples of the CS signals transmitted after the after various delay amounts and during use of the first reference voltage by the memory devices;
the processor is to select a latest rising edge and earliest falling edge for the first composite eye;
the processor is to determine a second composite eye based on rising and falling edges of the samples of the CS signals transmitted after the various delay amounts and during use of the second reference voltage by the memory devices;
the processor is to select a latest rising edge and earliest falling edge for the second composite eye; and
the processor is to select the reference voltage, from among the first and second references voltages, associated with the composite eye, from among the first and second composite eyes, that is closest to the reference eye width.

4. The host system of claim 3, wherein:
the processor is to select the delay to transmit as a time to a middle of the composite eye width associated with the selected reference voltage.

5. The host system of claim 1, wherein the reference eye width comprises a memory clock cycle.

6. The host system of claim 1, comprising the memory devices and wherein the memory devices comprise a rank of dynamic random access memory (DRAM) devices.

7. The host system of claim 1, wherein the processor is to commence a CS signal training scheme compatible with Joint Electronic Device Engineering Council Double Data Rate 5.

8. The host system of claim 1, wherein in an event that samples of the CS signal include a rising edge that is greater than a threshold distance from an earliest rising edge, the processor is to set the samples of the CS signal to provide a falling edge in place of the rising edge.

9. The host system of claim 1, wherein the memory controller is to apply the determined delay for transmission of the subsequent CS signal and the memory controller is to cause the memory devices to apply the determined reference voltage.

10. A method comprising:
starting a chip select (CS) training mode for a rank of memory devices;
setting a first reference voltage value for use by the memory devices;
during use of the first reference voltage:
transmitting a first CS signal to the rank at various time delay amounts,
receiving samples of the first CS signal having the various time delay amounts from the memory devices, and
determining a first composite eye based on a latest occurring rising edge and an earliest occurring falling edge of the samples from use of the first reference voltage;
setting a second reference voltage value for use by the memory devices;
during use of the second reference voltage:
transmitting a second CS signal to the rank at various time delay amounts, receiving samples of the second CS signal associated with use of the second reference voltage and various time delay amounts from the memory devices, and determining a second composite eye based on a latest occurring rising edge and an earliest occurring falling edge of the samples from use of the second reference voltage;

selecting a composite eye that is closest to a reference eye width;

selecting a reference voltage associated with the selected composite eye; and for the rank, determining a delay for transmission of a third CS signal based on a midpoint of the composite eye.

11. The method of claim 10, wherein the reference eye width comprises a memory clock cycle.

12. The method of claim 10, wherein the rank of memory devices comprises a rank of dynamic random access memory (DRAM) devices.

13. The method of claim 10, wherein the CS training mode is compatible with Joint Electronic Device Engineering Council Double Data Rate 5.

14. The method of claim 10, comprising:
based on determining that samples of the first CS signal include a rising edge that is greater than a threshold distance from an earliest rising edge, setting the samples of the first CS signal to provide a falling edge in place of the rising edge.

15. The method of claim 10, comprising:
applying, by a memory controller, the selected reference voltage and
applying, by the memory controller, the determined delay to transmission of the CS signal.

16. The method of claim 10, comprising:
starting a chip select (CS) training mode for a second rank of memory devices;
setting a first reference voltage value for use by the second rank of memory devices;
during use of the first reference voltage by the second rank of memory devices:
transmitting a fourth CS signal to the second rank of memory devices at various time delay amounts,
receiving samples of the fourth CS signal having the various time delay amounts from the memory devices from use of the first reference voltage by the second rank of memory devices, and
determining a first composite eye based on a latest occurring rising edge and an earliest occurring falling edge of the samples from use of the first reference voltage by the second rank of memory devices;
setting a second reference voltage value for use by the second rank of memory devices;
during use of the second reference voltage by the second rank of memory devices:
transmitting a fifth CS signal to the rank at various time delay amounts,
receiving samples of the fifth CS signal having the various time delay amounts from the memory devices from use of the second reference voltage by the second rank of memory devices, and
determining a second composite eye based on a latest occurring rising edge and an earliest occurring falling edge of the samples from use of the second reference voltage by the second rank of memory devices;
selecting a second composite eye that is closest to a reference eye width;
selecting a second reference voltage associated with the selected composite eye; and
for the second rank, determining a delay for transmission of a sixth CS signal based on a midpoint of the second composite eye.

17. A system comprising:
a host system comprising a processor, a memory controller, and memory devices, wherein the memory devices are coupled to the processor, wherein:
the processor is to cause application of one or multiple reference voltages by the memory devices and transmission of a chip select (CS) signal delayed at multiple delay times during use of one or more of the reference voltages;
the processor is to receive samples of the CS signal from the memory devices;
the processor is to determine a composite eye based on the samples for at least one of reference voltages;
the processor is to select a reference voltage associated with a composite eye that is closest to a reference eye width;
the processor is to select a delay time prior to transmission of the CS signal based on a time offset to a middle of the composite eye that is closest to the reference eye width; and
the memory controller is to apply the selected reference voltage to the memory devices and transmit a second CS signal based on the selected delay time to the memory devices.

18. The system of claim 17, wherein the host system comprises a personal computer, smart phone, blade, rack, or server.

19. The system of claim 17, wherein the reference eye width comprises 2 UI (unit intervals).

20. The system of claim 17, wherein the processor is to start a CS training mode based on Joint Electronic Device Engineering Council Double Data Rate 5.

* * * * *